US011825721B2

(12) United States Patent
Jin et al.

(10) Patent No.: US 11,825,721 B2
(45) Date of Patent: Nov. 21, 2023

(54) DISPLAY PANEL HAVING AN EMITTER DISPOSED ON A LIGHT CONVERSION PATTERN

(71) Applicant: Samsung Display Co., Ltd., Yongin-si (KR)

(72) Inventors: Youyoung Jin, Suwon-si (KR); Keunchan Oh, Hwaseong-si (KR); Chansu Kim, Gumi-si (KR); Jaemin Seong, Suwon-si (KR); Gak Seok Lee, Hwaseong-si (KR); Sun-Kyu Joo, Suwon-si (KR); Halim Ji, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 316 days.

(21) Appl. No.: 17/145,369

(22) Filed: Jan. 10, 2021

(65) Prior Publication Data
US 2022/0271095 A1 Aug. 25, 2022

(30) Foreign Application Priority Data

Apr. 3, 2020 (KR) .......................... 10-2020-0040718

(51) Int. Cl.
*H10K 59/38* (2023.01)
*H10K 50/856* (2023.01)
*H10K 50/86* (2023.01)

(52) U.S. Cl.
CPC .......... *H10K 59/38* (2023.02); *H10K 50/856* (2023.02); *H10K 50/865* (2023.02)

(58) Field of Classification Search
CPC ............. H01L 27/322; H01L 51/5271; H01L 51/5284; H01L 27/326

USPC .............................................. 257/40, 89, 79
See application file for complete search history.

(56) References Cited

U.S. PATENT DOCUMENTS

| 6,995,736 B2 | 2/2006 | Eida |
| 9,515,285 B2 | 12/2016 | Sato |
| 2014/0316052 A1* | 10/2014 | Agata .................... C09K 11/06 524/518 |
| 2015/0333102 A1* | 11/2015 | Sato ........................ H01L 33/58 257/13 |
| 2015/0340412 A1* | 11/2015 | Lee ..................... H01L 51/5268 438/34 |
| 2017/0125740 A1 | 5/2017 | Lee et al. |

(Continued)

FOREIGN PATENT DOCUMENTS

| JP | 4608170 | 1/2011 |
| JP | 6357349 | 7/2018 |

(Continued)

*Primary Examiner* — Nduka E Ojeh
(74) *Attorney, Agent, or Firm* — H.C. Park & Associates, PLC

(57) ABSTRACT

A display panel, includes: a base substrate including a pixel region and a peripheral region adjacent to the pixel region; a reflection pattern disposed on the base substrate; a light conversion pattern disposed on the base substrate and overlapping the reflection pattern, the light conversion pattern including a top surface and a side surface; an emitter disposed on the light conversion pattern to emit a source light, the emitter being in contact with at least the side surface of the light conversion pattern; a color filter disposed on the top surface of the light conversion pattern; and a light-blocking pattern disposed outside the color filter.

20 Claims, 13 Drawing Sheets

(56) References Cited

U.S. PATENT DOCUMENTS

2017/0154930 A1\* 6/2017 Kim ........................ H10K 59/38
2019/0096960 A1\* 3/2019 Lee ........................ H01L 51/502

FOREIGN PATENT DOCUMENTS

KR  10-2014-0042274   4/2014
KR  10-2014-0127136   11/2014
KR  10-2017-0051764   5/2017

\* cited by examiner

DISPLAY PANEL HAVING AN EMITTER DISPOSED ON A LIGHT CONVERSION PATTERN

CROSS-REFERENCE TO RELATED APPLICATIONS

This application claims priority from and the benefit of Korean Patent Application No. 10-2020-0040718, filed on Apr. 3, 2020, which is hereby incorporated by reference for all purposes as if fully set forth herein.

BACKGROUND OF THE INVENTION

Field

The invention relates generally to a display panel, and more particularly, to a display panel including a light conversion pattern.

Discussion of the Background

Display panels include a transmission-type display panel to selectively transmit light generated by a light source and an emission-type display panel to generate a source light. In order to produce a color image, the display panel includes different kinds of color control layers, according to the types of pixels used. The color control layer is configured to be transparent to light of a specific wavelength range or to change the color of the source light. In some cases, the color control layer is configured to change optical characteristics of the source light, without any change in color of the source light.

The above information disclosed in this Background section is only for understanding of the background of the inventive concepts, and, therefore, it may contain information that does not constitute prior art.

SUMMARY

Display devices constructed according to the principles and exemplary implementations of the invention have display panels with improved optical conversion efficiency. For example, according to the principles and some exemplary embodiments of the invention, an emission device may overlap an inclined surface of a light conversion pattern, when viewed in a plan view, and a source light emitted from the emission device may be incident upon the light conversion pattern, may be reflected, and then may be emitted to the outside through a light-emitting opening, which is defined on a top surface of the light conversion pattern by the emission device. The amount of light converted from the source light may be increased, and this may make it possible to improve optical conversion efficiency.

Additional features of the inventive concepts will be set forth in the description which follows, and in part will be apparent from the description, or may be learned by practice of the inventive concepts.

According to one aspect of the invention, a display panel, includes: a base substrate including a pixel region and a peripheral region adjacent to the pixel region; a reflection pattern disposed on the base substrate; a light conversion pattern disposed on the base substrate and overlapping the reflection pattern, the light conversion pattern including a top surface and a side surface; an emitter disposed on the light conversion pattern to emit a source light, the emitter being in contact with at least the side surface of the light conversion pattern; a color filter disposed on the top surface of the light conversion pattern; and a light-blocking pattern disposed outside the color filter.

The emitter may not overlap at least a portion of the top surface of the light conversion pattern, and the pixel region may be disposed on the top surface of the light conversion pattern and may not overlap the emitter.

The light-blocking pattern may overlap with the peripheral region.

The emitter may include an emission device having a first electrode, at least one emission structure disposed on the first electrode, and a second electrode disposed on the emission structure.

The first electrode may have source light transparency, and the second electrode have source light reflectiveness.

The at least one emission structure may include: an emission layer to emit the source light; and at least one of a first auxiliary layer, disposed between the first electrode and the emission layer, and a second auxiliary layer, disposed between the emission layer and the second electrode.

The second electrode may not overlap at least a portion of the top surface of the light conversion pattern.

The emitter may have a thickness of about 1 µm to about 20 µm.

The emission device may include a first emission device and a second emission device, which may be adjacent to each other, the first electrode of the first emission device and the first electrode of the second emission device may be integral, and the second electrode of the first emission device may be spaced apart from the second electrode of the second emission device.

A reflection layer may be disposed on the color filter to block light from an external light source.

A lower insulating layer disposed on the base substrate, an intermediate insulating layer disposed on the lower insulating layer, and an upper insulating layer disposed on the intermediate insulating layer, and the light conversion pattern may be disposed on the upper insulating layer.

The reflection pattern may be disposed on the intermediate insulating layer and may be overlapped with about 70% to about 99% of an area of the light conversion pattern.

The side surface of the light conversion pattern may include a first side surface, disposed in a first direction, and a second side surface, disposed in a second direction intersecting the first direction, and the emitter may be disposed on the first side surface.

The color filter may extend from the top surface to the second side surface.

The light-blocking pattern may cover the emitter.

According to another aspect of the invention, a display panel, includes: a base substrate including a pixel region and a peripheral region adjacent to the pixel region; a reflection pattern disposed on the base substrate; a light conversion pattern disposed on the base substrate and overlapping the reflection pattern, the light conversion pattern including a top surface and a side surface; an emitter disposed on the light conversion pattern to emit a source light, the emitter including a transmission electrode, a reflection electrode disposed on the transmission electrode, and an emission layer disposed between the transmission electrode and the reflection electrode; a color filter disposed on the top surface of the light conversion pattern; and a light-blocking pattern disposed outside the color filter and overlapping the peripheral region, wherein the reflection electrode may not overlap at least a portion of the top surface.

The light conversion pattern may include the top surface, which may be substantially parallel to the base substrate, and an inclined surface, angled from the top surface of the light conversion pattern with an inclined angle relative to a thickness direction of the base substrate, and the emitter may be disposed on the inclined surface.

The light conversion pattern may include a first light conversion pattern and a second light conversion pattern, adjacent to the first light conversion pattern, the emitter may include a first emitter disposed on the first light conversion pattern and a second emitter disposed on the second light conversion pattern, the transmission electrode of the first emitter and the transmission electrode of the second emitter may be integral, and the reflection electrode of the first emitter may be spaced apart from the reflection electrode of the second emitter.

According to a further aspect of the invention, a display panel, includes: a base substrate including a pixel region and a peripheral region adjacent to the pixel region; a reflection pattern disposed on the base substrate; a color filter disposed on the base substrate; a light conversion pattern disposed on the color filter, the light conversion pattern including a top surface and a side surface; an emitter disposed on the light conversion pattern to emit a source light, the emitter including a transmission electrode, an emission layer disposed on the transmission electrode, and a reflection electrode disposed on the emission layer; and a light-blocking pattern disposed outside the light conversion pattern and overlapping the reflection pattern, wherein the emitter overlaps the top and side surfaces of the light conversion pattern.

The reflection pattern may overlap the light-blocking pattern and may not overlap the light conversion pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
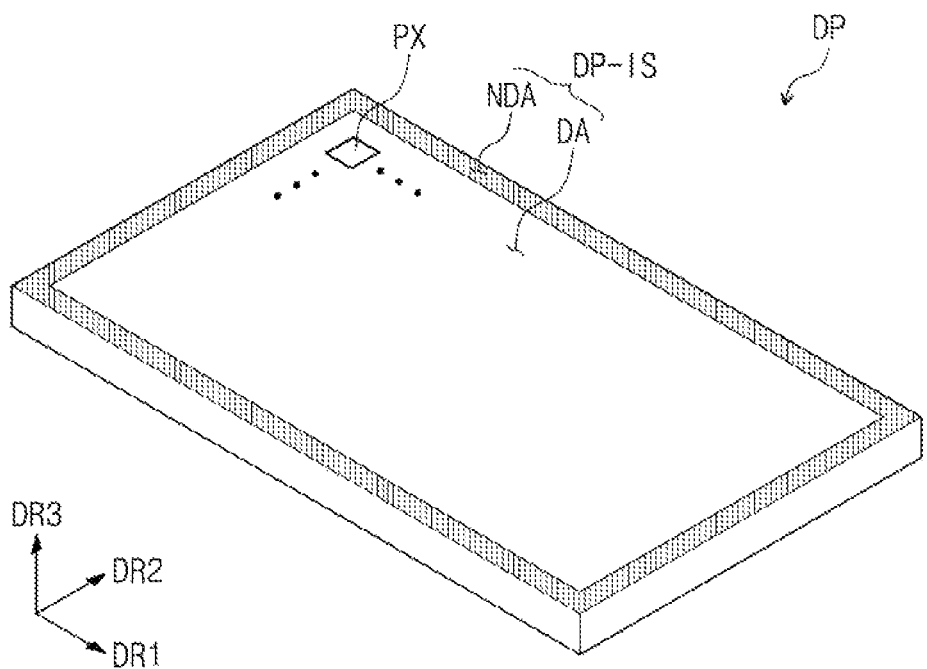
FIG. 1A is a perspective view illustrating an exemplary embodiment of a display panel constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of molecules and elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements, and thus repetitive descriptions may be omitted to avoid redundancy.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, the term "integral" means two or more parts or elements forming or functioning as a single unit or object.

Figure 1B:
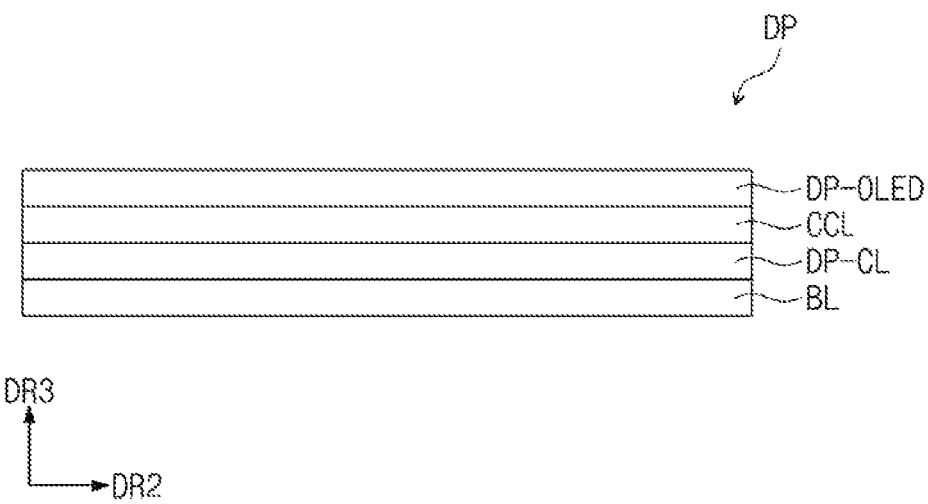
FIG. 1B is a cross-sectional view illustrating the display panel of FIG. 1A.
Figure 1C:
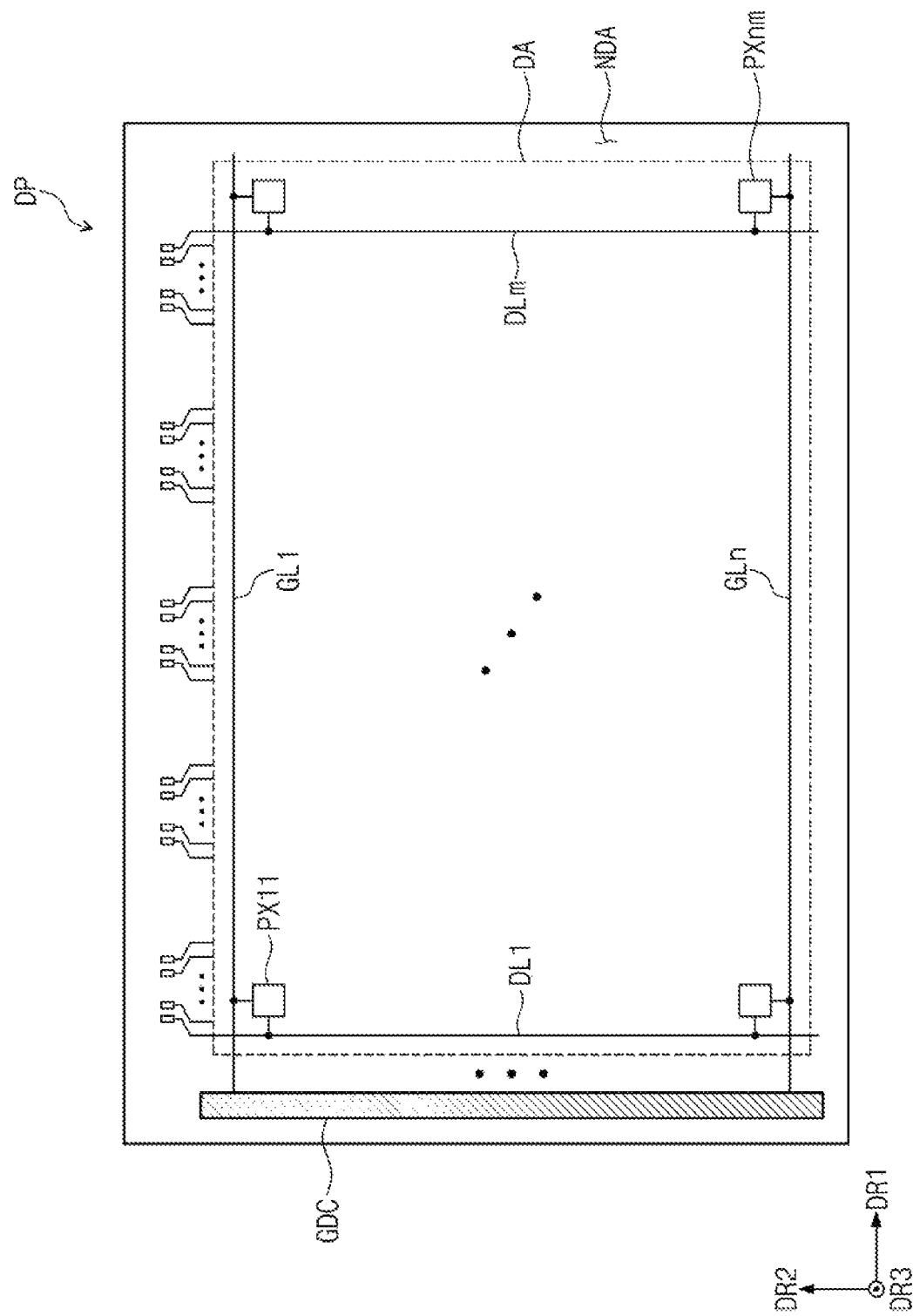
FIG. 1C is a plan view illustrating the display panel of FIG. 1A.

FIG. 1A is a perspective view illustrating an exemplary embodiment of a display panel constructed according to principles of the invention. +FIG. 1B is a cross-sectional view illustrating the display panel of FIG. 1A. FIG. 1C is a plan view illustrating the display panel of FIG. 1A.

As shown in FIG. 1A, a display panel DP may include a display surface DP-IS to display an image. The display surface DP-IS may be defined to be substantially parallel to a first direction axis DR1 and a second direction axis DR2. The display surface DP-IS may include a display region DA and a non-display region NDA. The pixels (a representative one of which labelled pixel PX is illustrated) may be disposed in the display region DA but not in the non-display region NDA. The non-display region NDA may be defined along an edge of the display surface DP-IS. The display region DA may be enclosed by the non-display region NDA. In some exemplary embodiments, the non-display region NDA may be omitted or may be locally disposed near one side portion of the display region DA.

As used herein, a third direction axis DR3 will be used to refer to the thickness direction of the display panel DP (i.e., the direction normal to the display surface DP-IS). The third direction DR3 may be used to differentiate a front or top surface of each element (e.g., a layer or a unit) from a back or bottom surface. However, the first to third direction axes DR1, DR2, and DR3 illustrated in some exemplary embodiments are just an example. Hereinafter, first to third directions may be directions indicated by the first to third direction axes DR1, DR2, and DR3, respectively, and will be identified with the same reference numbers.

In some exemplary embodiments, the display surface DP-IS of the display panel DP is illustrated to be of a generally flat type, but the exemplary embodiments are not limited to this example. The display panel DP may have a generally curved display surface or a three-dimensional display surface. The three-dimensional display surface may include a plurality of display regions, which are oriented in different directions.

As shown in FIG. 1B, the display panel DP may include a base substrate BL, a circuit device layer DP-CL, a light conversion pattern CCL, and an emission device DP-OLED. The base substrate BL may include a synthetic resin substrate or a glass substrate. The circuit device layer DP-CL may include at least one insulating layer and a circuit device.

The circuit device layer DP-CL may include signal lines, a pixel driving circuit, and so forth. The formation of the circuit device layer DP-CL may include forming an insulating layer, a semiconductor layer, and a conductive layer using a coating or deposition process and patterning the insulating layer, the semiconductor layer, and the conductive layer using a photolithography and/or etching process. The emission device DP-OLED may include at least an emission structure EMS (e.g., see FIG. 2B). The light conversion pattern CCL may be configured to change a wavelength (e.g., color) of light provided from the emission device DP-OLED. The light conversion pattern CCL may include a structure which is used to increase the optical conversion efficiency.

FIG. 1C illustrates the arrangement of signal lines GL1 to GLn and DL1 to DLm and pixels PX11 to PXnm, viewed in a plan view. The signal lines GL1 to GLn and DL1 to DLm may include a plurality of gate lines GL1 to GLn and a plurality of data lines DL1 to DLm.

Each of the pixels PX11 to PXnm may be connected to a corresponding one of the gate lines GL1 to GLn and a corresponding one of the data lines DL1 to DLm. Each of the pixels PX11 to PXnm may include a pixel driving circuit and an emission device. According to the structure of the pixel driving circuit of the pixels PX11 to PXnm, signal lines of other types may be further provided in the display panel DP.

An example, in which the pixels PX11 to PXnm are arranged in a matrix shape, is illustrated, but the exemplary embodiments are not limited to this example. The pixels PX11 to PXnm may be arranged in a generally pentile matrix shape. For example, the pixels PX11 to PXnm may be disposed at vertices of a generally diamond structure. A gate driving circuit GDC may be integrated on the display panel DP through an oxide silicon gate (OSG) driver circuit process or an amorphous silicon gate (ASG) driver circuit process.

Figure 2A:
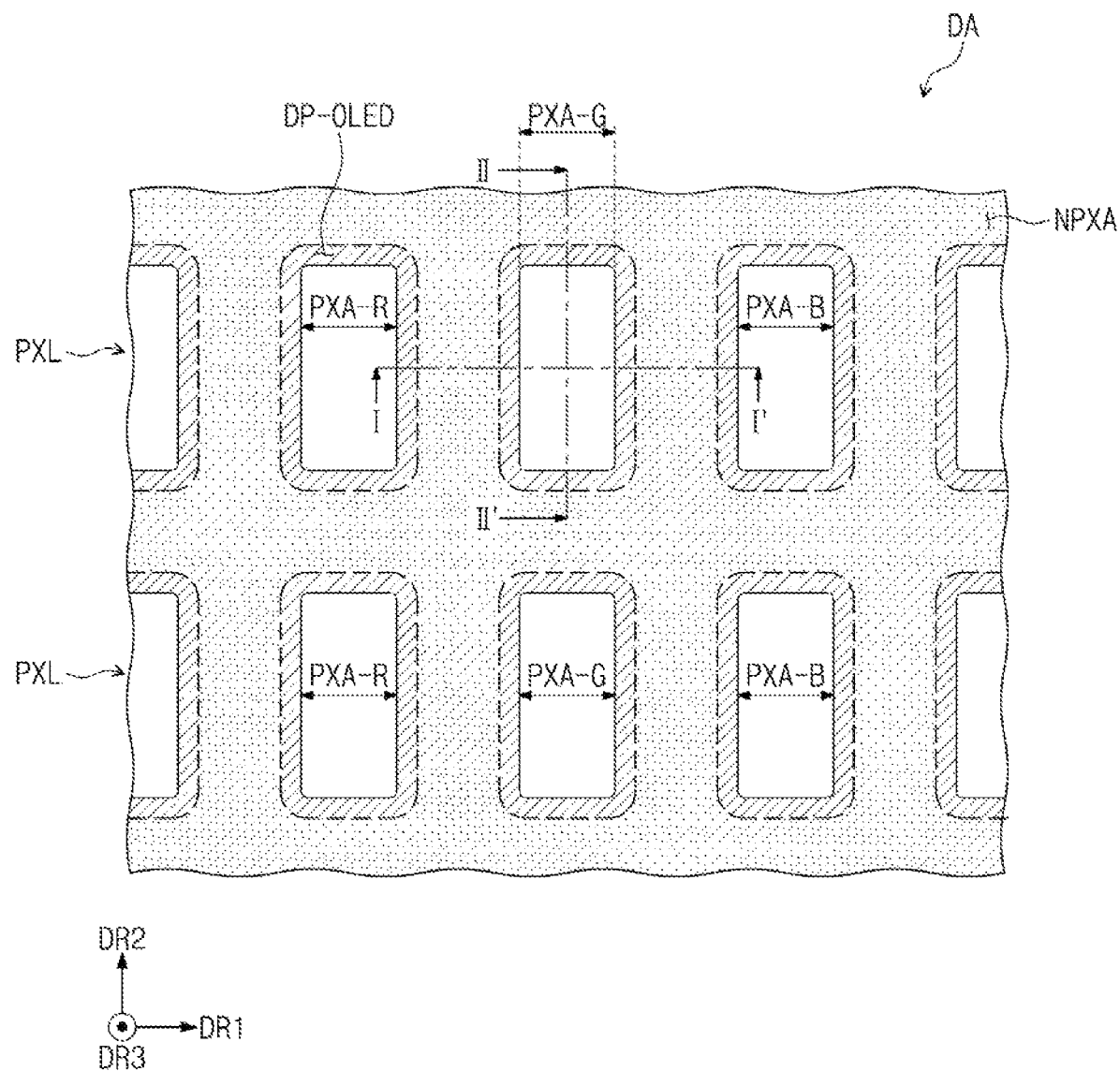
FIG. 2A is an enlarged plan view illustrating a portion of the display panel of FIG. 1C.
Figure 2B:
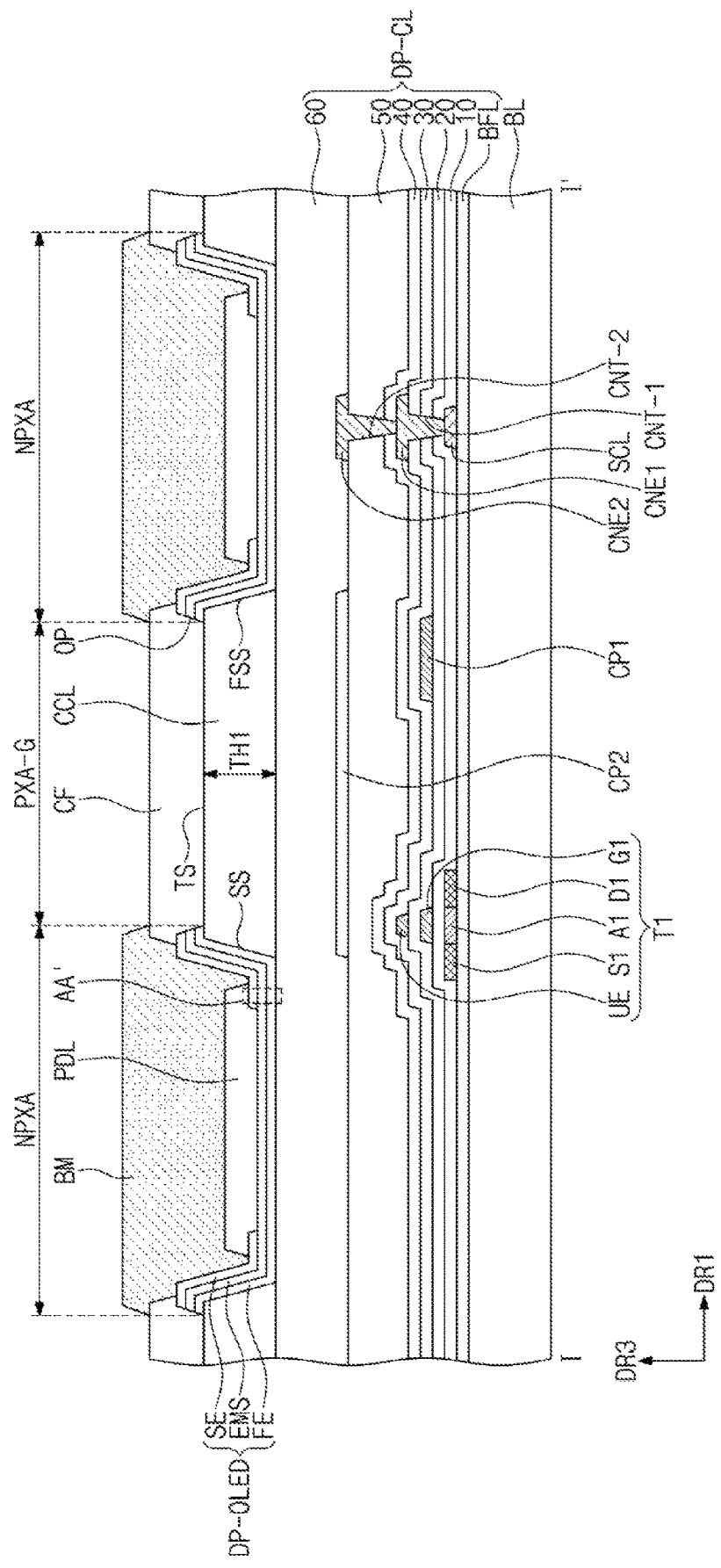
FIGS. 2B and 2D are cross-sectional views taken along line I-I' of FIG. 2A illustrating exemplary embodiments of the display panel constructed according to principles of the invention.
Figure 2C:
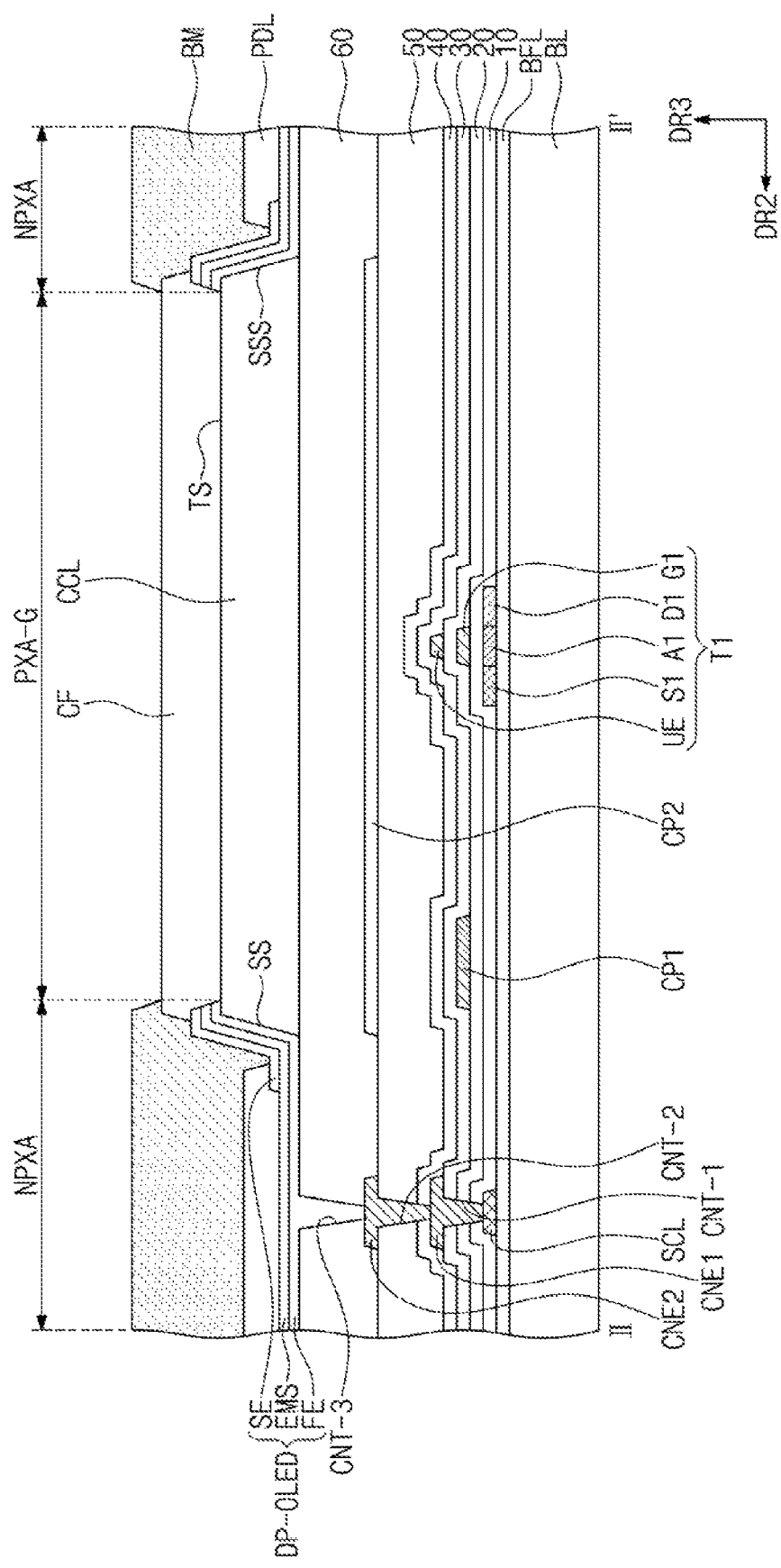
FIGS. 2C and 2E are cross-sectional views taken along line II-IF of FIG. 2A illustrating exemplary embodiments of the display panel constructed according to principles of the invention.
Figure 2D:
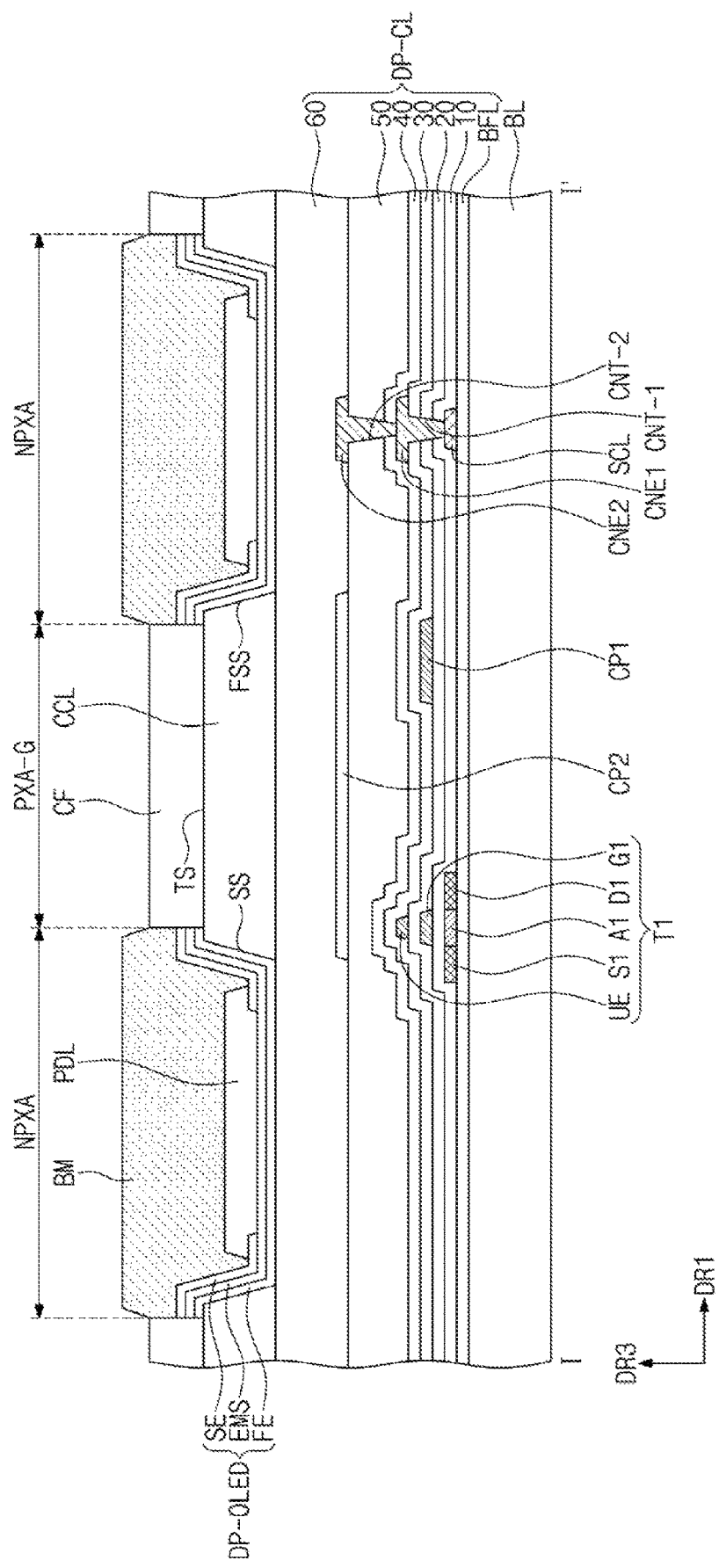
Figure 2E:
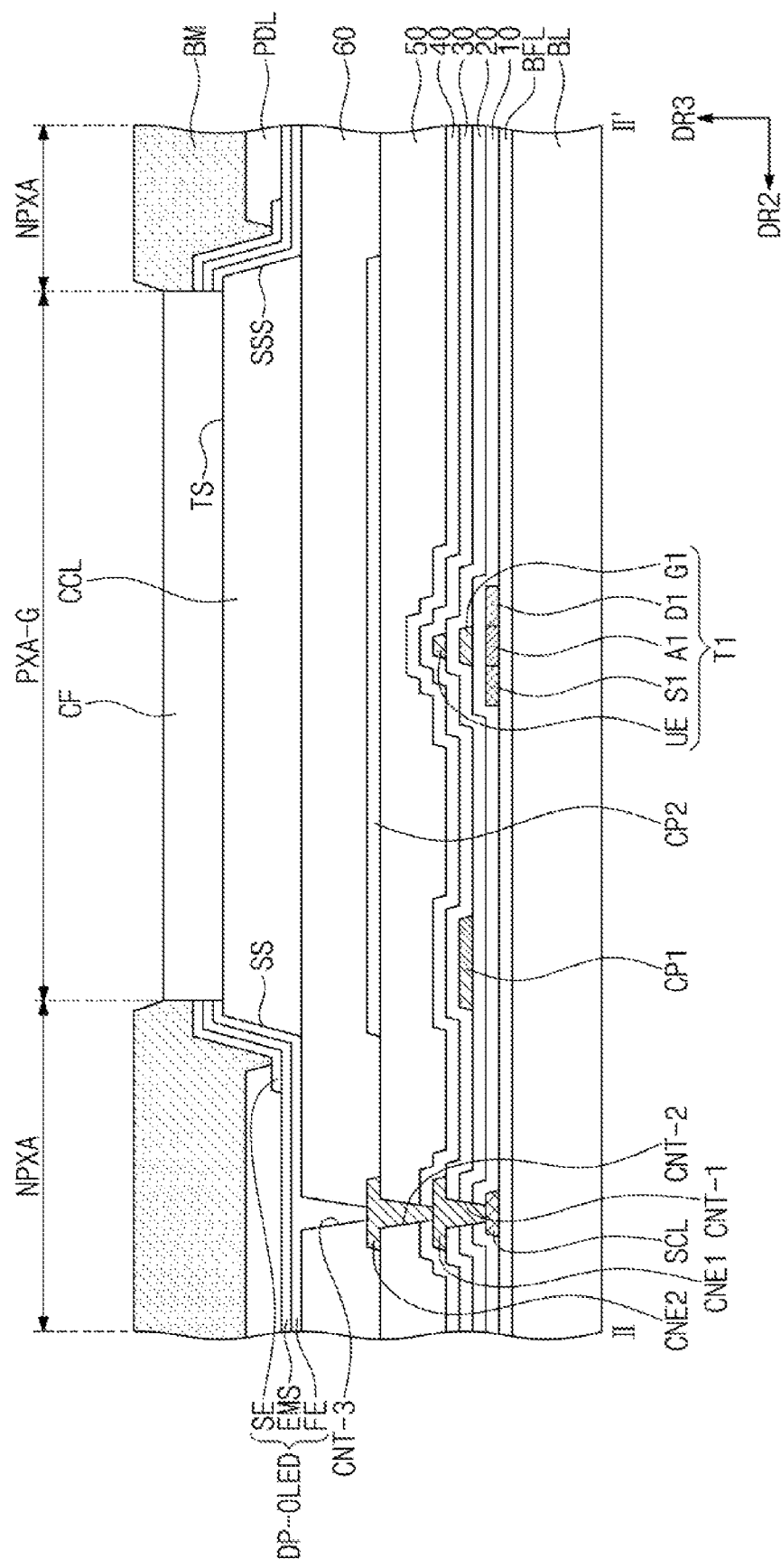
Figure 2F:
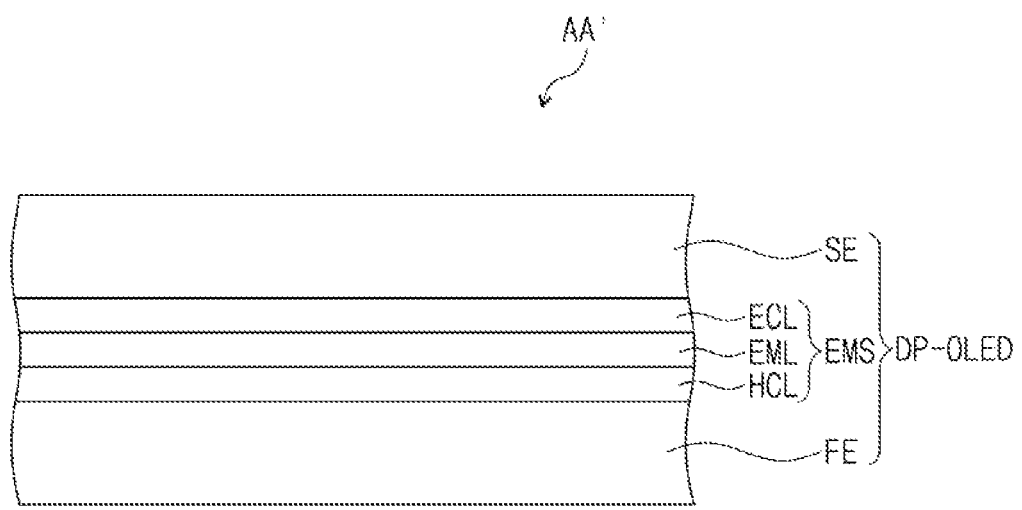
FIG. 2F is an enlarged cross-sectional view illustrating a portion AA' of the display panel of FIG. 2B.
Figure 2F:
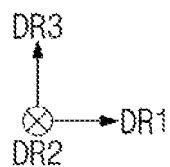

FIG. 2A is an enlarged plan view illustrating a portion of the display panel of FIG. 1C. FIGS. 2B and 2D are cross-sectional views taken along line I-I' of FIG. 2A illustrating exemplary embodiments of the display panel constructed according to principles of the invention. FIGS. 2C and 2E are cross-sectional views taken along line II-IF of FIG. 2A illustrating exemplary embodiments of the display panel constructed according to principles of the invention. FIG. 2F is an enlarged cross-sectional view illustrating a portion AA' of the display panel of FIG. 2B.

FIG. 2A exemplarily illustrates six pixel regions PXA-R, PXA-G, and PXA-B, which are included in two pixel rows PXL. FIGS. 2B and 2D illustrate cross-sections taken along a line I-I' of FIG. 2A. In some exemplary embodiments, three kinds of the pixel regions PXA-R, PXA-G, and PXA-B shown in FIG. 2A may be repeatedly disposed throughout the display region DA (e.g., see FIG. 1A).

A peripheral region NPXA may be defined around the first to third pixel regions PXA-R, PXA-G, and PXA-B. The peripheral region NPXA may delimit the first to third pixel regions PXA-R, PXA-G, and PXA-B. The peripheral region NPXA may enclose the first to third pixel regions PXA-R, PXA-G, and PXA-B. A structure, which prevents a color-mixing issue from occurring between the first to third pixel regions PXA-R, PXA-G, and PXA-B, may be disposed in the peripheral region NPXA. The color-mixing-preventing structure may include an organic layer with light-blocking and low-reflectance characteristics.

The first to third pixel regions PXA-R, PXA-G, and PXA-B may be defined by the emission device DP-OLED. The first to third pixel regions PXA-R, PXA-G, and PXA-B may be enclosed by the emission device DP-OLED. In other words, the emission device DP-OLED overlap the peripheral region NPXA.

In some exemplary embodiments, the first to third pixel regions PXA-R, PXA-G, and PXA-B are illustrated to have substantially the same planar area, but the exemplary embodiments are not limited to this example. At least two regions of the first to third pixel regions PXA-R, PXA-G, and PXA-B may have different planar areas from each other. The areas of the first to third pixel regions PXA-R, PXA-G, and PXA-B may be determined depending on color of light emitted therefrom. For example, a pixel region emitting a red light may have the largest area, and a pixel region emitting a blue light may have the smallest area.

The first to third pixel regions PXA-R, PXA-G, and PXA-B are illustrated to have generally rounded rectangular (or substantially rectangular) corners, when viewed in a plan view, but the exemplary embodiments are not limited to this example. For example, when viewed in a plan view, each or at least one of the first to third pixel regions PXA-R, PXA-G, and PXA-B may have other generally polygonal shapes (e.g., a generally lozengal shape, a generally pentagonal shape, and so forth).

One of the first to third pixel regions PXA-R, PXA-G, and PXA-B may be configured to provide a third color light corresponding to a source light, another may be configured to provide a first color light different from the third color light, and the other may be configured to provide a second color light different from the third and first color lights. In some exemplary embodiments, the third pixel region PXA-B may be configured to emit the third color light. In some exemplary embodiments, the first pixel region PXA-R may be configured to emit a red light, the second pixel region PXA-G may be configured to emit a green light, and the third pixel region PXA-B may be configured to emit a blue light.

FIGS. 2B and 2D are sectional views taken along a line I-I' of FIG. 2A. FIGS. 2C and 2E are sectional views taken along a line II-II' of FIG. 2A.

Referring to FIGS. 2B and 2D, the display panel DP may include a plurality of insulating layers, a semiconductor pattern, a conductive pattern, a signal line, and other components known in the art. An insulating layer, a semiconductor layer, and a conductive layer may be formed by a coating or deposition process. Thereafter, the insulating layer, the semiconductor layer, and the conductive layer may be selectively patterned using a photolithography process. Semiconductor patterns, conductive patterns, and signal lines constituting the circuit device layer DP-CL and the emitter, which may be in the form of the emission device DP-OLED, may be formed by this method.

In more detail, the display panel DP may include the circuit device layer DP-CL, which includes a plurality of insulating layers, a semiconductor pattern, a conductive pattern, a signal line, and so forth, the light conversion pattern CCL, which is disposed on the circuit device layer DP-CL, and the emission device DP-OLED, which is disposed on the light conversion pattern CCL. The display panel DP may include a color filter CF disposed on the light conversion pattern CCL and a light-blocking pattern BM disposed outside the color filter CF.

The base substrate BL may include a synthetic resin film. In some exemplary embodiments, the base substrate BL may include a glass substrate, a metal substrate, or an organic/inorganic composite substrate. At least one inorganic layer may be disposed on a top surface of the base substrate BL. A buffer layer BFL may enhance an adhesion strength between the base substrate BL and the semiconductor pattern. The buffer layer BFL may include at least one silicon oxide layer and at least one silicon nitride layer. The silicon oxide layer and the silicon nitride layer may be alternatingly stacked.

A semiconductor pattern may be disposed on the buffer layer BFL. The semiconductor pattern may be formed of or include a polysilicon. However, the exemplary embodiments are not limited to this example, and the semiconductor pattern may be formed of or include at least one of an amorphous silicon or one or more metal oxides.

FIGS. 2B to 2E illustrates just a portion of the semiconductor pattern, and when viewed in a plan view, a semiconductor pattern may be also provided in the first to third pixel regions PXA-R, PXA-G, and PXA-B (e.g., see FIG. 2A). In FIG. 2B, the second pixel region PXA-G is illustrated as a representative example of the pixel regions, but the first to third pixel regions PXA-R, PXA-G, and PXA-B (e.g., see FIG. 2A) may also be configured to have substantially the same technical features as those in the pixel region to be described below. The semiconductor patterns may be arranged with a specific rule throughout the first to third pixel regions PXA-R, PXA-G, and PXA-B (e.g., see FIG. 2A). Electrical characteristics of the semiconductor pattern may be changed depending on its doping state. The semiconductor pattern may include a doped region and an undoped region. The doped region may be doped with n- or p-type dopants. A p-type transistor may include an impurity region doped with p-type dopants.

The doped region may have conductivity higher than the undoped region and may be used as an electrode or a signal line substantially. The undoped region may correspond to substantially an active or a channel region of a transistor. In other words, a portion of the semiconductor pattern may be used as the active region of the transistor, another portion may be used as the source or drain region of the transistor, and other region may be used as a connection electrode or a connection signal line.

As shown in FIGS. 2B to 2E, a source region 51, an active region A1, a drain region D1 of a transistor T1 may be formed from the semiconductor pattern. FIG. 2B illustrates a portion of a connection signal line SCL formed from the semiconductor pattern. The connection signal line SCL may be connected to the drain region D1 of the transistor T1, when viewed in a plan view.

First to sixth insulating layers 10 to 60 may be disposed on the buffer layer BFL. Each of the first to sixth insulating layers 10 to 60 may be an inorganic layer or an organic layer. A gate electrode G1 may be disposed on the first insulating layer 10. An upper electrode UE may be disposed on the second insulating layer 20. A first conductive pattern CP1, in addition to the upper electrode UE, may be disposed on the second insulating layer 20. The first conductive pattern CP1, in conjunction with a second conductive pattern CP2 disposed on the fifth insulating layer 50, may constitute a capacitor. The capacitor may be connected to the transistor T1. The transistor T1 may include a driving transistor or a switching transistor, but the exemplary embodiments are not limited to this example.

A first connection electrode CNE1 may be disposed on the third insulating layer 30. The first connection electrode CNE1 may be coupled to the connection signal line SCL through a contact hole CNT-1 penetrating the first to third insulating layers 10, 20, and 30. A second connection electrode CNE2 may be disposed on the fifth insulating layer 50. The second connection electrode CNE2 may be coupled to the first connection electrode CNE1 through a contact hole CNT-2 penetrating the fourth insulating layer 40 and the fifth insulating layer 50.

In some exemplary embodiments, the first to fourth insulating layers 10, 20, 30, and 40 may be referred to as a lower insulating layer. The fifth insulating layer 50 may be referred to as an intermediate insulating layer, and the sixth insulating layer 60 may be referred to as an upper insulating layer.

The display panel DP may include a reflection pattern CP2, which is a portion of the second conductive pattern CP2. The reflection pattern CP2 may be disposed on the intermediate insulating layer 50. The reflection pattern CP2 may be formed of or include at least one of metallic materials. The reflection pattern CP2 and the second connection electrode CNE2 may be formed concurrently by a deposition process. The reflection pattern CP2 may reflect light, which is incident thereto, back in the direction from which it came.

The light conversion pattern CCL may be disposed on the base substrate BL. In detail, the light conversion pattern CCL may be disposed on the upper insulating layer 60. The light conversion pattern CCL may overlap the reflection pattern CP2. The reflection pattern CP2 may overlap about 70% to about 99% of the total area of the light conversion pattern CCL. In some exemplary embodiments, some of the light, which is emitted from the light conversion pattern CCL toward the base substrate BL, may be reflected by the reflection pattern CP2 and may be re-incident upon the light conversion pattern CCL.

The light conversion pattern CCL may absorb the source light, which is generated by the emission device DP-OLED, and then, may emit light having a wavelength or color different from the source light. The light conversion pattern CCL may include a base resin and quantum dots, which are mixed or dispersed in the base resin. The base resin may be a medium material, in which the quantum dots are dispersed, and may be made of at least one of various resin composites, which are called "binder" generally. However, the exemplary embodiments are not limited to this example, and in some exemplary embodiments, if the quantum dots can be dispersed in a medium material, the medium material may be referred to as a base resin, regardless of its name, additional function, or constituents. The base resin may be a polymer resin. For example, the base resin may be acrylic resins, urethane resins, silicone resins, and/or epoxy resins. The base resin may be transparent.

Quantum dots are particles causing a change in wavelength of an incident light. Each of the quantum dots may have a nanometer-order crystalline material consisting of hundreds to thousands of atoms and may exhibit an increase in band gap, due to its small size and the consequent quantum confinement effect. In the case where an energy of light incident to the quantum dots is larger than a band gap of the quantum dots, each of the quantum dots may absorb the light to transition to an excited state, and then, may emit light of a specific wavelength when returning to its ground state. The wavelength of the emitted light may be determined by the band gap. That is, by adjusting sizes or compositions of the quantum dots, it may be possible to control the quantum confinement effect and the light-emitting characteristics of the light conversion pattern CCL.

The quantum dot may be selected from the group consisting of II-VI compounds, III-V compounds, IV-VI compounds, IV elements, IV compounds, and combination thereof.

The II-VI compounds may be selected from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The compounds may be selected from the group consisting of ternary compounds (e.g., including $AgInS_2$, $CuInS_2$, $AgGaS_2$, and $CuGaS_2$), mixtures of the ternary compounds, quaternary compounds (e.g., including $AgInGaS_2$ and $CuInGaS_2$), and mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InNP, InNAs, InNSb, InPAs, and InPSb), mixtures of the ternary compounds, quaternary compounds (e.g., including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds. In some exemplary embodiments, the III-V compounds may further include one of the group II metals. For example, InZnP or the like may be selected as such a III-II-V compound.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The IV elements may be selected from the group consisting of Si, Ge, and mixtures of thereof. The IV compounds may include binary compounds selected from the group consisting of SiC, SiGe, and combination thereof. The binary, ternary, or quaternary compound may have a uniform concentration throughout the particle or may have a spatially varying concentration distribution in each particle.

The quantum dots may have a core-shell structure including a core and a shell enclosing the core. In some exemplary embodiments, the quantum dots may have a core/shell structure, in which one quantum dot is enclosed by another quantum dot. At an interface between the core and the shell, an element contained in the shell may have a concentration gradient decreasing in a central direction.

Each of the quantum dots may be a nanometer-scale particle. Each of the quantum dots may have a light-emitting wavelength spectrum whose full width half maximum (FWHM) is less than about 45 nm (in particular, less than about 40 nm or in more particular, less than about 30 nm), and in this case, it may be possible to improve color purity or color reproduction characteristics. Furthermore, the quantum dots may allow light to be emitted radially, and thus, it may be possible to improve a viewing angle property.

In some exemplary embodiments, the quantum dots may be a generally spherical-shaped, a generally pyramidal-shaped, a generally multi-arm-shaped, or a generally cubic-shaped nano particle. In another exemplary embodiment, the quantum dots may be a generally nano tube-shaped, a nano wire-shaped, a nano fiber-shaped, a nano plate-shaped particle, but the exemplary embodiments are not limited to these examples. A wavelength or color of light emitted from the quantum dot may be determined by the particle size of the quantum dot, and thus, in the case where the quantum dots are provided in various sizes, lights converted by the quantum dots may have various colors (e.g., red, green, and blue).

The light conversion pattern CCL may include a top surface TS and a side surface SS. The top surface TS of the light conversion pattern CCL may be substantially parallel to the base substrate BL. The side surface SS of the light conversion pattern CCL may be extended from the top surface TS of the light conversion pattern CCL in the thickness direction of the base substrate BL. In some exemplary embodiments, the side surface SS may be an inclined surface that is angled from the top surface TS with an inclined angle to the thickness direction of the base substrate BL. In some exemplary embodiments, the side surface SS of the light conversion pattern CCL may include first side surfaces FSS, which are disposed in the first direction DR1, and second side surfaces SSS, which are disposed in the second direction DR2 intersecting the first direction DR1. For example, the light conversion pattern CCL may have a generally hexahedral shape, the first side surfaces may be two side surfaces, which are opposite to each other in the first direction DR1, and the second side surfaces may be two side surfaces, which are opposite to each other in the second direction DR2.

In some exemplary embodiments, the thickness TH1 of the light conversion pattern CCL may range from about 1 μm to about 20 μm. The thickness TH1 of the light conversion pattern CCL may correspond to a length from a top surface of the upper insulating layer 60 to the top surface TS of the light conversion pattern CCL measured in the third direction DR3.

The emission device DP-OLED may generate the source light described above. Referring to FIGS. 2B to 2E, the emission device DP-OLED may include a first electrode FE, a second electrode SE, and the emission structure EMS provided therebetween. In some exemplary embodiments, the emission device DP-OLED may include an organic light emitting diode. In some exemplary embodiments, the emission device DP-OLED may include a quantum-dot light-emitting diode. In some exemplary embodiments, the emission device DP-OLED may include a pixel definition layer PDL. The pixel definition layer PDL may be an organic layer. In some exemplary embodiments, the pixel definition layer PDL may have a black color. The pixel definition layer PDL may include a black coloring agent. The pixel definition layer PDL may include a black dye or a pigment, which is mixed in a base resin.

In some exemplary embodiments, the display panel DP may further include a refractive index control layer, which is provided between the emission device DP-OLED and the light conversion pattern CCL and is used to improve light-emitting efficiency of the display panel DP. The emission device DP-OLED may be disposed on the light conversion pattern CCL. The pixel region PXA-G and the peripheral region NPXA adjacent to the pixel region PXA-G are illustrated in FIG. 2B. The pixel region PXA may substantially correspond to a region, in which the emission device DP-OLED is not disposed on the light conversion pattern CCL.

The emission device DP-OLED may be in contact with the side surface SS of the light conversion pattern CCL. In some exemplary embodiments, the emission device DP-OLED may be in contact with both the first and second side surfaces FSS and SSS.

In some exemplary embodiments, the emission device DP-OLED may not overlap at least a portion of the top surface TS of the light conversion pattern CCL. The emission device DP-OLED may define a light-emitting opening OP, which does not overlap with the top surface TS of the light conversion pattern CCL. In the display panel DP, light generated by the emission device DP-OLED may be emitted to the outside through the light conversion pattern CCL and the light-emitting opening OP. The light-emitting opening OP may correspond to the pixel region PXA-G.

The first electrode FE may be in contact with the light conversion pattern CCL. The second electrode SE may be disposed on the first electrode FE. The emission structure EMS may be disposed between the first electrode FE and the second electrode SE. The emission structure EMS will be described in more detail with reference to FIG. 2F.

The first electrode FE may be a transparent electrode. The first electrode FE may correspond to an anode or a cathode. The second electrode SE may be a reflection electrode. The second electrode SE may be formed of or include at least one of metallic materials. In the case where the first electrode FE is the anode, the second electrode SE may be the cathode, and in the case where the first electrode FE is the cathode, the second electrode SE may be the anode. The source light, which is emitted from the emission structure EMS, may be reflected by the second electrode SE and may be incident into the light conversion pattern CCL through the first electrode FE, which is transparent.

Referring to FIGS. 2B to 2D, the first electrode FE and the second electrode SE may be disposed on the side surface SS of the light conversion pattern CCL. The emission device DP-OLED including the first electrode FE, the second electrode SE, and the emission structure EMS may define the light-emitting opening OP exposing the top surface TS of the light conversion pattern CCL.

In some exemplary embodiments, a plurality of the emission devices DP-OLED may be provided in the display region DA. The emission device DP-OLED may include a first emission device and a second emission device, which define different pixel regions from each other. The first and second emission devices may be spaced apart from each other in the first direction DR1 or the second direction DR2. In some exemplary embodiments, the peripheral region NPXA provided with the light-blocking pattern BM may be defined on each of the first and second emission devices. The first electrode FE of the first emission device and the first electrode FE of the second emission device may be integral, e.g., provided in the form of a unitary object. The second electrode SE of the first emission device may be spaced apart from the second electrode SE of the second emission device. One of the first and second electrodes FE and SE may correspond to an anode, and the other may correspond to a cathode.

The light conversion pattern CCL may include a first light conversion pattern and a second light conversion pattern. The first and second light conversion patterns may be spaced apart from each other in the first direction DR1 or the second direction DR2. The first emission device may be disposed on the first light conversion pattern, and the second emission device may be disposed on the second light conversion pattern. The first and second light conversion patterns may be disposed in the display region DA.

The color filter CF may be disposed on the light conversion pattern CCL. The color filter CF may overlap with the top surface TS of the light conversion pattern CCL. The color filter CF may be configured to transmit light, which is converted by the light conversion pattern CCL, but to block the source light. The color filter CF may absorb light, which is leaked from a neighboring pixel region. The color filter CF may include a base resin and a dye and/or a pigment dispersed in the base resin. The base resin may be a medium material, in which the dye and/or pigment is dispersed, and may be made of at least one of various resin composites, which are called "binder" generally.

Referring to FIGS. 2B and 2C, the color filter CF may cover a portion of the emission device DP-OLED stacked on the light conversion pattern CCL. The color filter CF may be stacked after stacking the emission device DP-OLED on the light conversion pattern CCL.

Referring to FIGS. 2D and 2E, the color filter CF may be stacked on the light conversion pattern CCL, before the formation of the emission device DP-OLED. The color filter CF may be disposed on a portion of the top surface of the light conversion pattern CCL, which does not overlap the emission device DP-OLED. The emission device DP-OLED may be in contact with a side surface of the color filter CF. In some exemplary embodiments, the emission device DP-OLED may be stacked on opposite side surfaces and a portion of the top surface of the light conversion pattern CCL, which are not covered with the color filter CF.

The light-blocking pattern BM may be disposed outside the color filter CF. The light-blocking pattern BM may overlap the peripheral region NPXA. The light-blocking pattern BM may cover the emission device DP-OLED. The light-blocking pattern BM, along with the emission device DP-OLED, may define the pixel region PXA-G. In some exemplary embodiments, the light-blocking pattern BM may correspond to an organic layer with light-blocking and low-reflectance characteristics.

Referring to FIG. 2C, the first electrode FE may be connected to the second connection electrode CNE2 through a third contact hole CNT-3. The third contact hole CNT-3 may overlap the peripheral region NPXA. In the peripheral region NPXA, the emission device DP-OLED may be connected to a transistor, in various manners, through a connection pattern. The first electrode FE, which is connected to the transistor through the third contact hole CNT-3, may correspond to an anode. In the case where the second electrode SE corresponds to the anode, the second electrode SE may be connected to the transistor through the third contact hole CNT-3, which is formed to penetrate the first electrode FE and the sixth insulating layer 60. As described above, the first electrode FE may correspond to the transparent electrode, and the second electrode SE may correspond to a reflection electrode.

FIG. 2F is an enlarged sectional view illustrating a portion AA' of FIG. 2B.

Referring to FIG. 2F, the emission structure EMS may include a first auxiliary layer HCL, a second auxiliary layer ECL, and an emission layer EML. The first auxiliary layer HCL may correspond to a hole control layer HCL, and the second auxiliary layer ECL may correspond to an electron control layer ECL. In some exemplary embodiments, the emission device DP-OLED may include at least one emission structure EMS. For example, the emission device DP-OLED may include four emission structures EMS between the first electrode FE and the second electrode SE. Each of the emission structures EMS may include the first auxiliary layer HCL (hereinafter, a hole control layer), the second auxiliary layer ECL (hereinafter, an electron control layer), and the emission layer EML.

The hole control layer HCL may be disposed in both pixel region PXA-G and the peripheral region NPXA. The hole control layer HCL may include a hole transport layer and, in some exemplary embodiments, the hole control layer HCL may further include a hole injection layer. The emission layer EML may be disposed on the hole control layer HCL. The emission layer EML may be disposed in a region corresponding to the light-emitting opening OP. That is, the emission layer EML may be formed to have a plurality of patterns, which are separately and respectively provided in the first to third pixel regions PXA-R, PXA-G, and PXA-B (e.g., see FIG. 2A). The emission layer EML may be configured to generate a blue light. The blue light may have a wavelength ranging from about 410 nm to about 480 nm. The light-emitting spectrum of the blue light may have a highest peak within a wavelength range of about 440 nm to about 460 nm. The electron control layer ECL may be disposed on the emission layer EML. The electron control layer ECL may include an electron transport layer and, in some exemplary embodiments, the electron control layer ECL may further include an electron injection layer. The second electrode SE may be disposed on the electron control layer ECL. In some exemplary embodiments, the emission structure EMS may include the emission layer EML and may include at least one of the hole control layer HCL and the electron control layer ECL.

Figure 3:
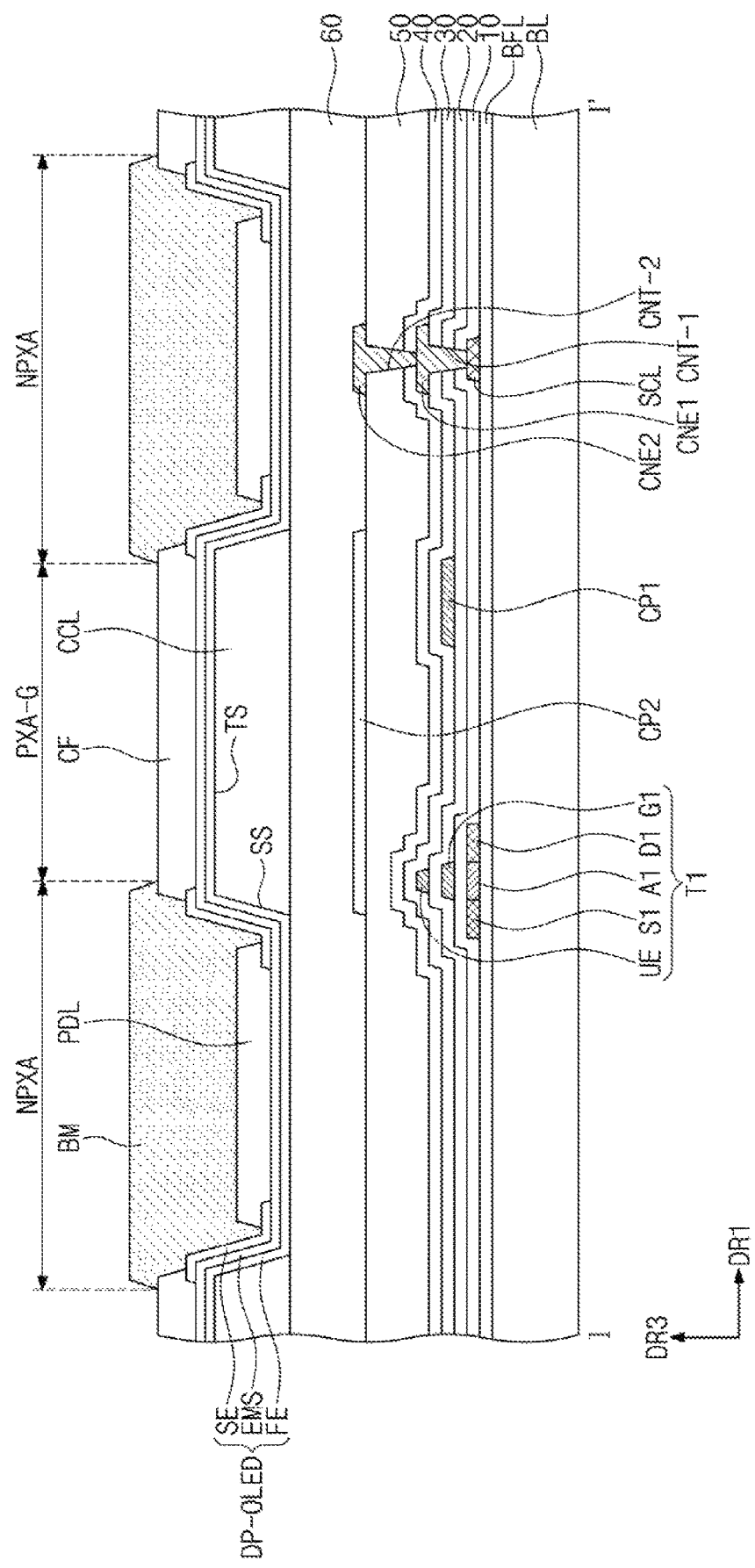
FIG. 3 is a cross-sectional view taken along line I-I' of FIG. 2A illustrating another exemplary embodiment of a display panel constructed according to principles of the invention.

FIG. 3 is a cross-sectional view taken along line I-I' of FIG. 2A illustrating another exemplary embodiment of a display panel constructed according to principles of the invention.

Referring to FIG. 3, the first electrode FE may overlap both of the top TS and side surfaces SS of the light conversion pattern CCL, and the second electrode SE may overlap the side surface SS of the light conversion pattern CCL but may not overlap at least a portion of the top surface TS of the light conversion pattern CCL. The first electrode FE may correspond to a transmission electrode, which is transparent to light emitted from the top surface TS of the light conversion pattern CCL, and the second electrode SE may correspond to the reflection electrode. The second electrode SE may not overlap the top surface of the light conversion pattern CCL and may define the pixel region PXA-G. The emission structure EMS may have a transparent property and may overlap the first electrode FE. In some exemplary embodiments, a portion of the second electrode SE, which does not overlap the top surface TS of the light conversion pattern CCL, may correspond to the pixel region PXA-G. The second electrode SE may define the pixel region PXA-G.

Figure 4A:
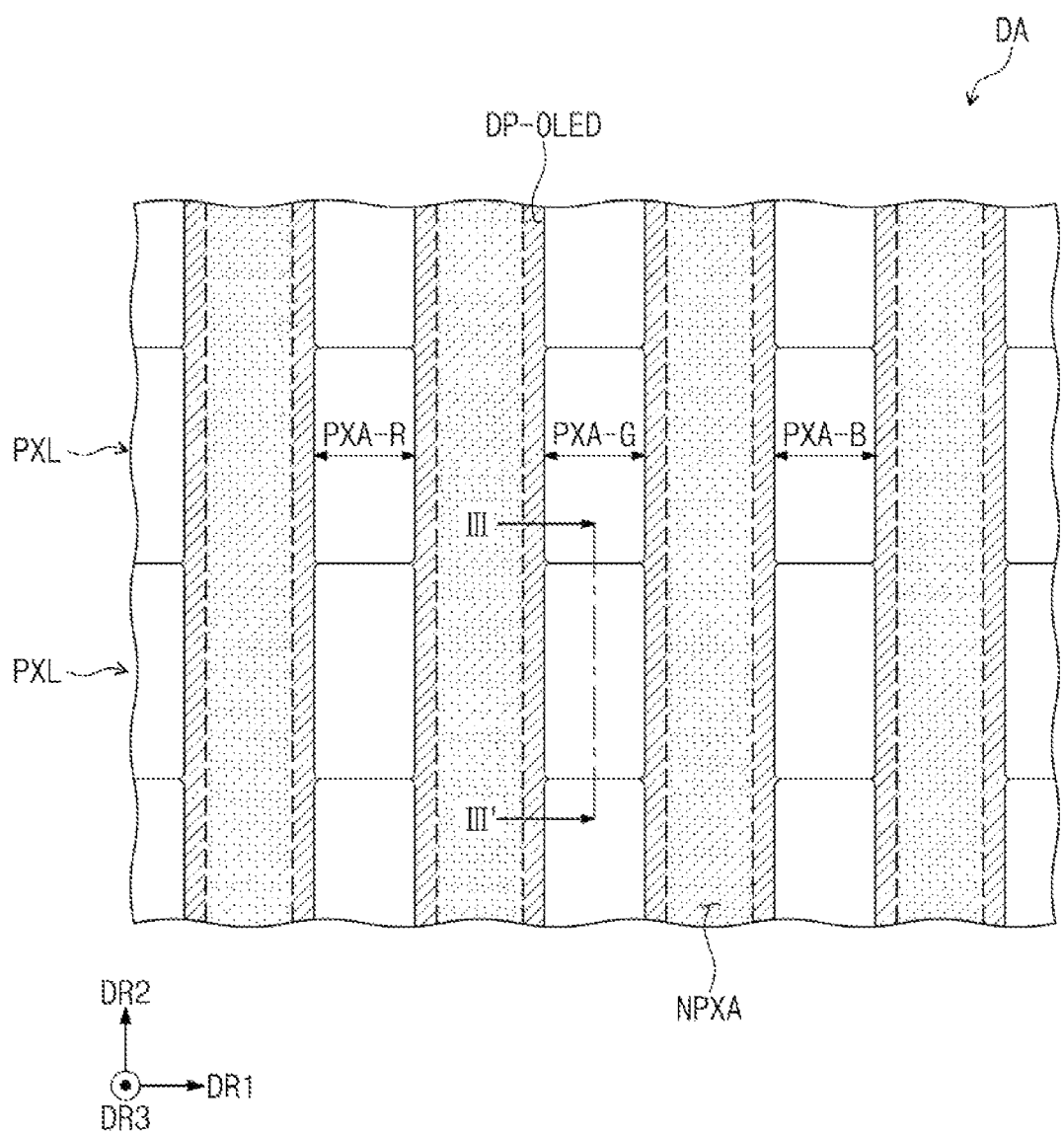
FIG. 4A is an enlarged plan view illustrating a portion of an exemplary embodiment of a display panel constructed according to principles of the invention.
Figure 4B:
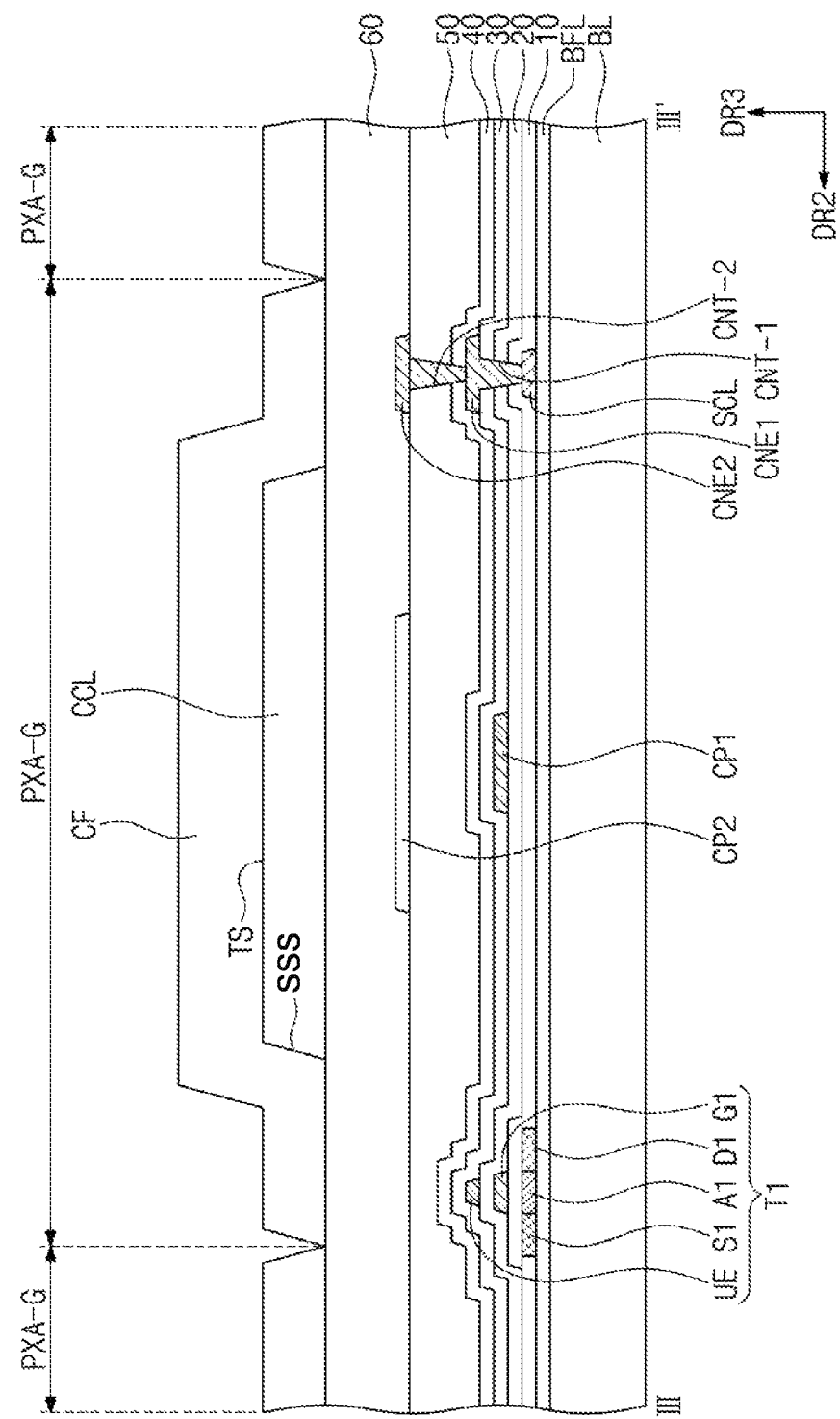
FIG. 4B is a cross-sectional view taken along line of FIG. 4A illustrating an exemplary embodiment of the display panel.

FIG. 4A is an enlarged plan view illustrating a portion of an exemplary embodiment of a display panel constructed according to principles of the invention. FIG. 4B is a cross-sectional view taken along line of FIG. 4A illustrating an exemplary embodiment of the display panel.

Referring to FIGS. 4A and 4B, the first to third pixel regions PXA-R, PXA-G, and PXA-B may be defined by the emission device DP-OLED. Each of the first to third pixel regions PXA-R, PXA-G, and PXA-B may include a plurality of regions, which are consecutively arranged in the second direction DR2. The emission device DP-OLED may enclose the first to third pixel regions PXA-R, PXA-G, and PXA-B in the first direction DR1. The emission device DP-OLED may define the first to third pixel regions PXA-R, PXA-G, and PXA-B.

In some exemplary embodiments, the emission device DP-OLED may be in contact with the first side surface FSS of the light conversion pattern CCL disposed in the first direction DR1. In other words, the emission device DP-OLED may not overlap the top surface TS and the second side surface SSS of the light conversion pattern CCL. In some exemplary embodiments, not only the top surface TS but also the second side surface SSS of the light conversion pattern CCL may be exposed. The exposed top surface TS and second side surface SSS of the light conversion pattern CCL may define a pixel region. Thus, the pixel region may be expanded in every pixel.

In some exemplary embodiments, the emission device DP-OLED may be in contact with the second side surface SSS of the light conversion pattern CCL. In some exemplary embodiments, the emission device DP-OLED may not overlap the top surface TS and the first side surface FSS of the light conversion pattern CCL.

The color filter CF may be disposed in every pixel. The color filter CF may be disposed on the light conversion pattern CCL to cover the top surface TS and the second side surface SSS of the light conversion pattern CCL. In some exemplary embodiments, the color filters CF may be consecutively arranged in the second direction DR2.

Figure 5:
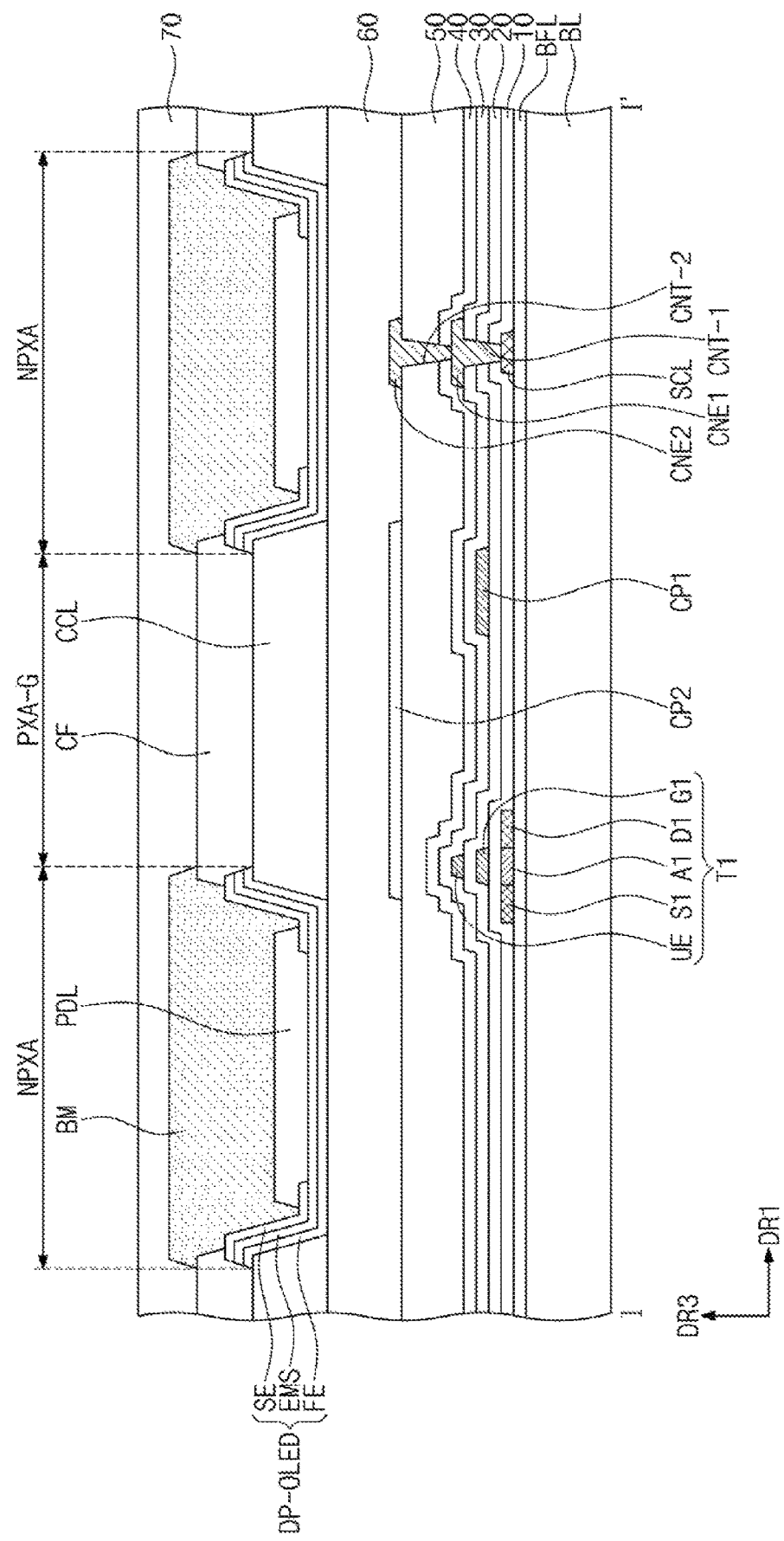
FIG. 5 is a cross-sectional view taken along line I-I' of FIG. 2A illustrating another exemplary embodiment of the display panel constructed according to principles of the invention.

FIG. 5 is a cross-sectional view taken along line I-I' of FIG. 2A illustrating another exemplary embodiment of the display panel constructed according to principles of the invention.

Referring to FIG. 5, the display panel DP may include a reflection layer 70 covering the color filter CF. The color filter CF may be disposed on the light-emitting opening OP (e.g., see FIG. 2B) corresponding to the pixel region PXA-G, and the reflection layer 70 may be used to block an external light incident into the pixel region PXA-G. The reflection layer 70 may be, for example, an anti-reflection film.

Figure 6:
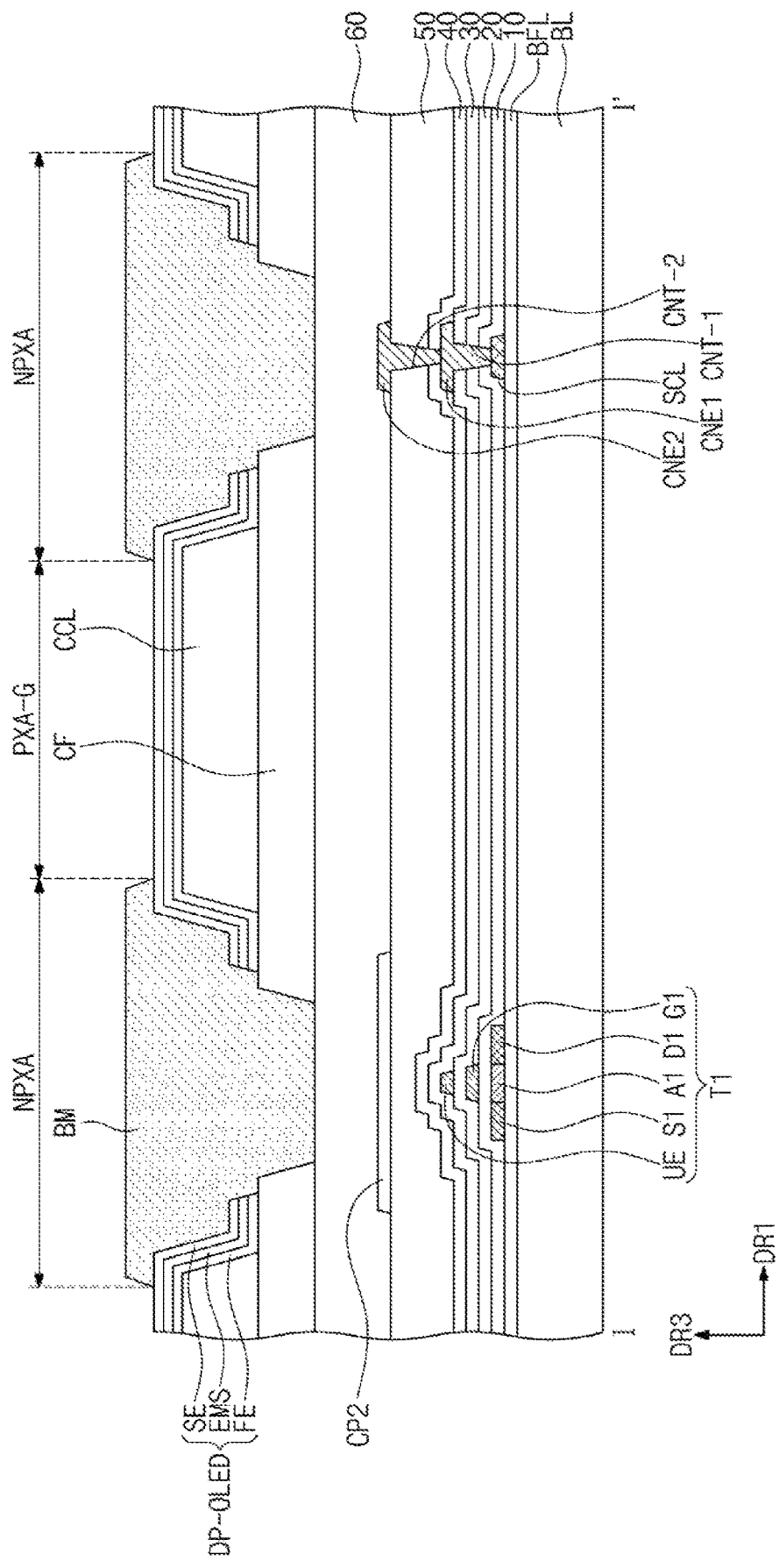
FIG. 6 is a cross-sectional view taken along line I-I' of FIG. 2A illustrating another exemplary embodiment of the display panel constructed according to principles of the invention.

FIG. 6 is a cross-sectional view taken along line I-I' of FIG. 2A illustrating another exemplary embodiment of the display panel constructed according to principles of the invention.

Referring to FIG. 6, the display panel DP may include the color filter CF disposed on the base substrate BL, the light conversion pattern CCL disposed on the color filter CF, and the emission device DP-OLED disposed on the light conversion pattern CCL.

As shown in FIG. 6, the emission device DP-OLED may cover both of the top surface TS and side surface SS of the light conversion pattern CCL. The light conversion pattern CCL may convert the source light, which is provided from the emission device DP-OLED, into a conversion light. The display panel DP may emit the conversion light, which is provided from the light conversion pattern CCL, toward the base substrate BL through the color filter CF disposed below the light conversion pattern CCL. In other words, the light-emitting opening OP according to the exemplary embodiments may be defined on the base substrate BL.

In some exemplary embodiments, not only the transmission electrode FE of the emission device DP-OLED but also the reflection electrode SE on the transmission electrode FE may overlap both of the top surface TS and side surface SS of the light conversion pattern CCL. The reflection electrode SE may reflect most of the source light, which is generated by the emission layer EML of the emission device DP-OLED, toward the base substrate BL through the light conversion pattern CCL disposed below the emission device DP-OLED. In some exemplary embodiments, the color filter CF may be omitted, and the upper insulating layer 60 may be configured to have a similar function as that of the color filter. In some exemplary embodiments, the reflection pattern CP2 disposed on the base substrate BL may not overlap the light conversion pattern CCL and the color filter CF and may overlap the peripheral region NPXA.

According to the principles and some exemplary embodiments of the invention, an emission device may be overlap an inclined surface of a light conversion pattern, when viewed in a plan view, and a source light emitted from the emission device may be incident upon the light conversion pattern, may be reflected, and then may be emitted to the outside through a light-emitting opening, which is defined on a top surface of the light conversion pattern by the emission device. The amount of light converted from the source light may be increased, and this may make it possible to improve optical conversion efficiency.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising:
    a base substrate including a pixel region and a peripheral region adjacent to the pixel region;
    a reflection pattern disposed on the base substrate;
    a light conversion pattern disposed on the base substrate and overlapping the reflection pattern, the light conversion pattern comprising a top surface and a side surface;
    an emitter disposed on the light conversion pattern to emit a source light, the emitter being in contact with at least the side surface of the light conversion pattern;
    a color filter disposed on the top surface of the light conversion pattern; and
    a light-blocking pattern disposed outside the color filter in a plan view,
    wherein a portion of the light-blocking pattern does not overlap with the color filter in a plan view.

2. The display panel of claim 1, wherein the emitter does not overlap at least a portion of the top surface of the light conversion pattern, and
    the pixel region is disposed on the top surface of the light conversion pattern and does not overlap the emitter.

3. The display panel of claim 1, wherein the light-blocking pattern overlaps the peripheral region.

4. The display panel of claim 1, wherein the emitter comprises an emission device having a first electrode, at least one emission structure disposed on the first electrode, and a second electrode disposed on the emission structure.

5. The display panel of claim 4, wherein the first electrode has source light transparency, and the second electrode has source light reflectiveness.

6. The display panel of claim 5, wherein the second electrode does not overlap at least a portion of the top surface of the light conversion pattern.

7. The display panel of claim 4, wherein the at least one emission structure comprises:
    an emission layer to emit the source light; and
    at least one of a first auxiliary layer, disposed between the first electrode and the emission layer, and a second auxiliary layer, disposed between the emission layer and the second electrode.

8. The display panel of claim 4, wherein the emission device comprises a first emission device and a second emission device, which are adjacent to each other, the first electrode of the first emission device and the first electrode of the second emission device are integral, and
    the second electrode of the first emission device is spaced apart from the second electrode of the second emission device.

9. The display panel of claim 1, wherein the emitter has a thickness of about 1 μm to about 20 μm.

10. The display panel of claim 1, further comprising a reflection layer, disposed on the color filter to block light from an external light source.

11. The display panel of claim 1, further comprising a lower insulating layer disposed on the base substrate, an intermediate insulating layer disposed on the lower insulating layer, and an upper insulating layer disposed on the intermediate insulating layer, and the light conversion pattern is disposed on the upper insulating layer.

12. The display panel of claim 11, wherein the reflection pattern is disposed on the intermediate insulating layer and is overlapped with about 70% to about 99% of an area of the light conversion pattern.

13. The display panel of claim 1, wherein the side surface of the light conversion pattern comprises a first side surface, disposed in a first direction, and a second side surface, disposed in a second direction intersecting the first direction, and
    the emitter is disposed on the first side surface.

14. The display panel of claim 13, wherein the color filter extends from the top surface to the second side surface.

15. The display panel of claim 1, wherein the light-blocking pattern covers the emitter.

16. A display panel, comprising:
    a base substrate including a pixel region and a peripheral region adjacent to the pixel region;
    a reflection pattern disposed on the base substrate;
    a light conversion pattern disposed on the base substrate and overlapping the reflection pattern, the light conversion pattern comprising a top surface and a side surface;
    an emitter disposed on the light conversion pattern to emit a source light, the emitter comprising a transmission electrode, a reflection electrode disposed on the transmission electrode, and an emission layer disposed between the transmission electrode and the reflection electrode;
    a color filter disposed on the top surface of the light conversion pattern; and
    a light-blocking pattern disposed outside the color filter and overlapping the peripheral region,
    wherein the reflection electrode does not overlap at least a portion of the top surface.

17. The display panel of claim 16, wherein the light conversion pattern comprises the top surface, which is substantially parallel to the base substrate, and an inclined surface, angled from the top surface of the light conversion pattern with an inclined angle relative to a thickness direction of the base substrate, and
    the emitter is disposed on the inclined surface.

18. The display panel of claim 16, wherein the light conversion pattern comprises a first light conversion pattern and a second light conversion pattern adjacent to the first light conversion pattern,
    the emitter comprises a first emitter disposed on the first light conversion pattern and a second emitter disposed on the second light conversion pattern, the transmission electrode of the first emitter and the transmission electrode of the second emitter are integral, and the reflection electrode of the first emitter is spaced apart from the reflection electrode of the second emitter.

19. A display panel, comprising:

a base substrate including a pixel region and a peripheral region adjacent to the pixel region;

a reflection pattern disposed on the base substrate;

a color filter disposed on the base substrate;

a light conversion pattern disposed on the color filter, the light conversion pattern comprising a top surface and a side surface;

an emitter disposed on the light conversion pattern to emit a source light, the emitter comprising a transmission electrode, an emission layer disposed on the transmission electrode, and a reflection electrode disposed on the emission layer; and a light-blocking pattern disposed outside the light conversion pattern and overlapping the reflection pattern, wherein the emitter overlaps the top and side surfaces of the light conversion pattern.

20. The display panel of claim 19, wherein the reflection pattern overlaps the light-blocking pattern and does not overlap the light conversion pattern.

* * * * *